(12) United States Patent
Gion (10) Patent No.: US 8,344,786 B2
(45) Date of Patent: Jan. 1, 2013

(54) SEMICONDUCTOR INTEGRATED CIRCUIT

(75) Inventor: Masahiro Gion, Kyoto (JP)

(73) Assignee: Panasonic Corporation, Osaka (JP)

( * ) Notice: Subject to any disclaimer, the term of this patent is extended or adjusted under 35 U.S.C. 154(b) by 21 days.

(21) Appl. No.: 13/177,805

(22) Filed: Jul. 7, 2011

(65) Prior Publication Data

US 2011/0285448 A1 Nov. 24, 2011

Related U.S. Application Data (63) Continuation of application No. PCT/JP2010/006951, filed on Nov. 29, 2010.

(30) Foreign Application Priority Data

Nov. 30, 2009 (JP) ................................. 2009-271388

(51) Int. Cl.
*H03L 5/00* (2006.01)

(52) U.S. Cl. ........................................................ 327/333

(58) Field of Classification Search .................. None
See application file for complete search history.

(56) References Cited

U.S. PATENT DOCUMENTS

| | | | | |
|---|---|---|---|---|
| 4,945,395 A | * | 7/1990 | Suehiro .......................... | 257/203 |
| 5,134,314 A | * | 7/1992 | Wehrmacher ..................... | 326/9 |
| 5,461,333 A | * | 10/1995 | Condon et al. ................. | 327/208 |
| 6,222,213 B1 | * | 4/2001 | Fujiwara ........................ | 257/210 |
| 6,677,780 B2 | * | 1/2004 | Tanaka et al. .................... | 326/62 |
| 6,721,933 B2 | * | 4/2004 | Iwasa .............................. | 257/203 |
| 7,165,232 B2 | * | 1/2007 | Chen et al. ..................... | 257/203 |
| 7,488,995 B2 | * | 2/2009 | Usami et al. .................. | 257/203 |
| 2004/0174755 A1 | | 9/2004 | Anazawa | |
| 2006/0236175 A1 | * | 10/2006 | Usami et al. .................. | 714/724 |
| 2007/0019493 A1 | | 1/2007 | Toba et al. | |

FOREIGN PATENT DOCUMENTS

| | | |
|---|---|---|
| JP | 02-310946 | 12/1990 |
| JP | 04-127556 | 4/1992 |
| JP | 06-013588 | 1/1994 |
| JP | 09-153551 | 6/1997 |
| JP | 2000-021987 | 1/2000 |
| JP | 2004-273607 | 9/2004 |
| JP | 2007-035672 | 2/2007 |

* cited by examiner

*Primary Examiner* — Lincoln Donovan
*Assistant Examiner* — Khareem E Almo
(74) *Attorney, Agent, or Firm* — McDermott Will & Emery LLP (57) ABSTRACT

A semiconductor integrated circuit includes a level shift circuit which is located so that a second IO cell region is interposed between the level shift circuit and a first IO cell region, and converts a signal output from an IO cell of the first IO cell region into a signal having an amplitude of a second voltage and outputs the resultant signal, and an internal circuit which is operated using the signal having the amplitude of the second voltage output from the level shift circuit. A signal interconnect via which the signal output from the IO cell of the first IO cell region is input to the level shift circuit is provided between the IO cell of the first IO cell region and the level shift circuit, extending over or in an IO cell of the second IO cell region.

42 Claims, 11 Drawing Sheets

SEMICONDUCTOR INTEGRATED CIRCUIT

CROSS-REFERENCE TO RELATED APPLICATIONS

This is a continuation of PCT International Application PCT/JP2010/006951 filed on Nov. 29, 2010, which claims priority to Japanese Patent Application No. 2009-271388 filed on Nov. 30, 2009. The disclosures of these applications including the specifications, the drawings, and the claims are hereby incorporated by reference in their entirety.

BACKGROUND

The present disclosure relates to semiconductor integrated circuits having a first and a second IO cell region, in each of which one or more IO cells into and from a signal having a first voltage amplitude is input and output are formed.

Japanese Patent Publication No. 2000-21987 describes a semiconductor device in which an internal logic circuit region is doubly surrounded by two sets of IO cells arranged in a square ring (in other words, the IO cells are arranged in two square rings (a double square ring) around the internal logic circuit region).

In recent years, as microfabrication technology has been advanced, the breakdown voltages of elements formed on semiconductor integrated circuits have decreased. Therefore, in order to maintain the reliability of the elements, voltages used in the internal circuits of semiconductor integrated circuits tends to be lowered. On the other hand, in systems, such as electronic devices etc., voltages having conventional levels are still used in parts outside the internal circuit (hereinafter referred to as "external parts"). Therefore, the voltages of signals transmitted to and received from the external parts have levels different from those of voltages used in the internal circuit.

Therefore, it is contemplated that a level shift circuit may be provided in an IO cell, and a high-voltage signal transmitted to and received from the external parts is converted into a low-voltage signal suitable for the internal circuit using the level shift circuit in the IO cell. However, if such IO cells are arranged in two lines (double line) in a peripheral portion of the semiconductor integrated circuit (i.e., one (inner line) of the two lines is surrounded by the other line (outer line)), a low-voltage signal transferred between the outer IO cell and the internal circuit passes through a region of the inner IO cell where a high-voltage signal is used, and therefore, is affected by crosstalk caused by the high-voltage signal. As a result, noise occurs in a signal input from the outer IO cell to the internal circuit. Similarly, a low-voltage signal output from the internal circuit toward the outer IO cell passes through the region of the inner IO cell where a high-voltage signal is used, and therefore, is affected by crosstalk caused by the high-voltage signal. As a result, noise occurs in a signal output from the internal circuit to the outer IO cell. In particular, in state-of-the-art microfabrication technology, the voltage of external parts is three or more times as high as the voltage of the internal circuit, and therefore, noise caused by crosstalk further increases, there is a possibility that a signal is not correctly transferred.

SUMMARY

The present disclosure describes implementations of a semiconductor integrated circuit including IO cells arranged in a double or higher multiple line, in which noise occurring in a signal transferred between the internal circuit and the IO cell is reduced or prevented.

An example semiconductor integrated circuit according to the present disclosure is a semiconductor integrated circuit having a first and a second IO cell region each including at least one IO cell into and from which a signal having an amplitude of a first voltage is input and output. The semiconductor integrated circuit includes a level shift circuit located so that the second IO cell region is interposed between the level shift circuit and the first IO cell region, and configured to convert a signal output from the IO cell of the first IO cell region into a signal having an amplitude of a second voltage and output the signal having the amplitude of the second voltage, and an internal circuit configured to be operated using the signal having the amplitude of the second voltage output from the level shift circuit. A signal interconnect via which the signal output from the IO cell of the first IO cell region is input to the level shift circuit is provided between the IO cell of the first IO cell region and the level shift circuit, extending over or in the IO cell of the second IO cell region.

According to the example semiconductor integrated circuit, the signal output from the IO cell of the first IO cell region passes over or in the IO cell of the second IO cell region while remaining at the amplitude of the first voltage, i.e., without being converted into the amplitude of the second voltage. Therefore, the influence of crosstalk on the signal output from the IO cell of the first IO cell region due to the signal in the IO cell of the second IO cell region can be reduced.

Another example semiconductor integrated circuit according to the present disclosure is a semiconductor integrated circuit having a first and a second IO cell region each including at least one IO cell into and from which a signal having an amplitude of a first voltage is input and output. The semiconductor integrated circuit includes an internal circuit configured to be operated using a signal having an amplitude of a second voltage, and a level shift circuit located so that the second IO cell region is interposed between the level shift circuit and the first IO cell region, and configured to convert the signal having the amplitude of the second voltage output from the internal circuit into the signal having the amplitude of the first voltage and output the signal having the amplitude of the first voltage. A signal interconnect via which the signal output from the level shift circuit is input to the IO cell of the first IO cell region is provided between the IO cell of the first IO cell region and the level shift circuit, extending over or in the IO cell of the second IO cell region.

According to the example semiconductor integrated circuit, the signal output from the internal circuit is converted into the signal having the amplitude of the first voltage before passing over or in the IO cell of the second IO cell region. Therefore, the influence of crosstalk on the signal input to the IO cell of the first IO cell region due to the signal in the IO cell of the second IO cell region can be reduced.

According to the present disclosure, the influence of crosstalk on the signal output from the IO cell of the first IO cell region due to the signal in the IO cell of the second IO cell region can be reduced, whereby the reliability of the operation of the semiconductor integrated circuit can be improved.

DETAILED DESCRIPTION

Embodiments of the present disclosure will be described hereinafter with reference to the accompanying drawings.

First Embodiment

Figure 1:
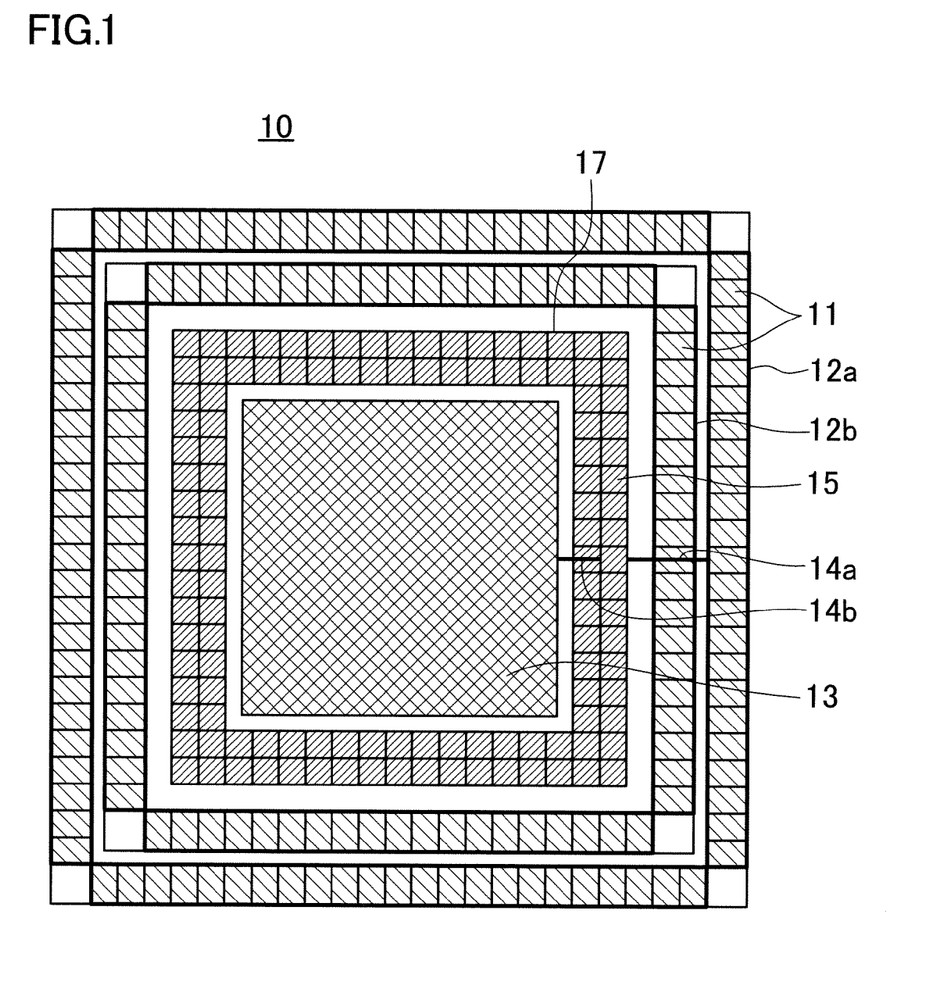
FIG. 1 is a plan view of a semiconductor integrated circuit according to a first embodiment of the present disclosure.

FIG. 1 shows a semiconductor integrated circuit (semiconductor chip) 10 according to a first embodiment of the present disclosure. The semiconductor integrated circuit 10 is formed in the shape of a square. A plurality of IO cells 11 are provided in a peripheral portion of the semiconductor integrated circuit 10. The IO cells 11 are also arranged, without a gap between each IO cell 11, in two lines (an inner line and an outer line, i.e., a double line) extending along the entire circumference of the semiconductor integrated circuit 10, where the inner line is surrounded by the outer line. Each IO cell 11 outputs a signal having an amplitude of 3.3 V (first voltage) to a part (hereinafter referred to as an external part) which is provided outside the semiconductor integrated circuit 10, and receives a signal having an amplitude of 3.3 V from the external part. A region where the outer IO cells 11 are provided is a first IO cell region 12a having a square ring shape, and a region where the inner IO cells 11 are provided is a second IO cell region 12b having a square ring shape.

A plurality of level shift circuits 15 are provided in a region which is closer to the center of the semiconductor integrated circuit 10 than the second IO cell region 12b is. The level shift circuits 15 are also arranged, without a gap between each level shift circuit 15, in two square rings (an inner square ring and an outer square ring, i.e., a double square ring), where the inner square ring is surrounded by the outer square ring. Some of the level shift circuits 15 convert a signal output from the IO cell 11 of the first IO cell region 12a into a signal having an amplitude of 1.0 V (second voltage), which is lower than 3.3 V, and output the resultant signal, and other level shift circuits 15 convert a signal output from the IO cell 11 of the second IO cell region 12b into a signal having an amplitude of 1.0 V and output the resultant signal. The region where the level shift circuits 15 are provided is a level shift circuit region 17. The second IO cell region 12b is interposed between the level shift circuit region 17 and the first IO cell region 12a.

Figure 2:
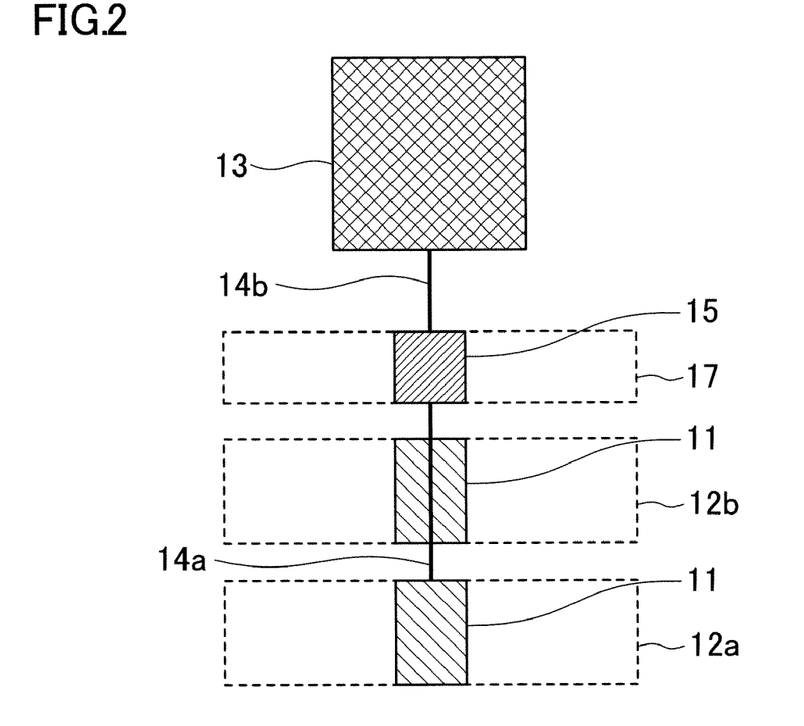
FIG. 2 is a diagram for describing a path of a high-voltage signal interconnect in the first embodiment of the present disclosure.

As shown in FIG. 2, for each IO cell 11 of the first IO cell region 12a, a first voltage signal interconnect 14a is provided between the first IO cell region 12a and the corresponding level shift circuit 15, extending over the corresponding IO cell 11 of the second IO cell region 12b. The first voltage signal interconnect 14a is used to input a signal output from the IO cell 11 to the level shift circuit 15. In FIG. 1, only one first voltage signal interconnect 14a is shown, and the other first voltage signal interconnects 14a are not shown. Note that the first voltage signal interconnect 14a may be extended inside the IO cell 11 instead of being extended over the IO cell 11.

In a region which is closer to the center of the semiconductor integrated circuit 10 than the level shift circuit 15 is, an internal circuit 13 is provided which is operated using the signal having an amplitude of 1.0 V output from the level shift circuit 15. The internal circuit 13, which includes a signal processing circuit, a memory circuit, etc. (not shown), outputs a signal having an amplitude of 1.0 V.

A second voltage signal interconnect 14b is provided between the level shift circuit 15 and the internal circuit 13. The signal having an amplitude of 1.0 V output from the level shift circuit 15 is input to the internal circuit 13 via the second voltage signal interconnect 14b.

Figure 3:
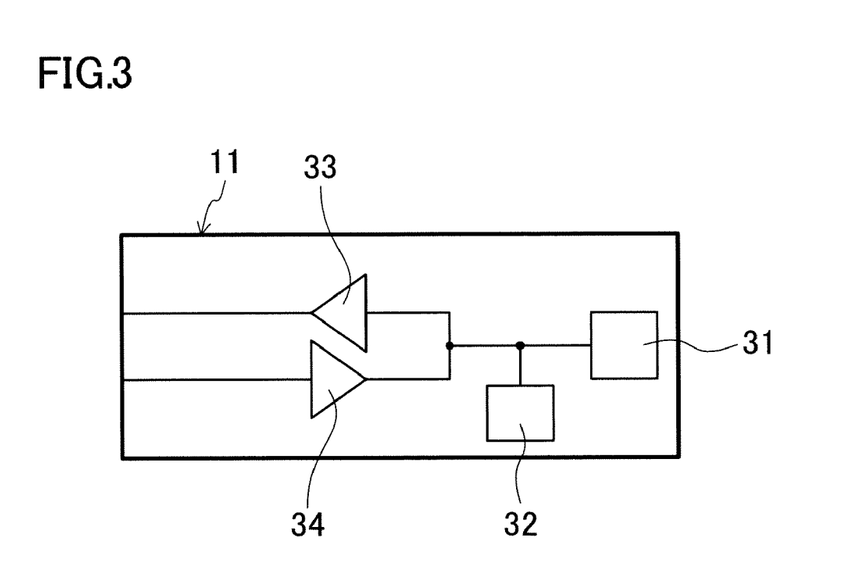
FIG. 3 is a circuit diagram showing a configuration of an IO cell in the first embodiment of the present disclosure.

FIG. 3 shows a configuration of the IO cell 11. The IO cell 11 includes an external bonding pad 31 at which the IO cell 11 contacts the outside of the semiconductor integrated circuit 10, an input buffer 33 and an output buffer 34 which are used to transfer a signal between the IO cell 11 and the internal circuit 13, and an electrostatic protection circuit 32 which protects the IO cell 11 from damage due to external static electricity. Note that not all of these components are essential to the IO cell 11, and the IO cell 11 may include components other than the above components. The IO cell 11 may be a power supply cell.

In the semiconductor integrated circuit 10 thus configured, a signal having an amplitude of 3.3 V which is input from the outside to the IO cell 11 of the first IO cell region 12a is input to the level shift circuit 15 via the first voltage signal interconnect 14a extending over the IO cell 11 of the second IO cell region 12b. The level shift circuit 15 converts the signal having an amplitude of 3.3 V into a signal having an amplitude of 1.0 V which is an operating voltage level of the internal circuit 13, and outputs the resultant signal. The signal having an amplitude of 1.0 V output by the level shift circuit 15 is input via the second voltage signal interconnect 14b to the internal circuit 13.

Thus, the voltage of the first voltage signal interconnect 14a extending over the IO cell 11 of the second IO cell region 12b is equal to the operating voltage of the IO cell 11 of the second IO cell region 12b, i.e., both the voltages are 3.3 V. Therefore, the influence of crosstalk on the signal of the first voltage signal interconnect 14a due to the signal in the IO cell 11 of the second IO cell region 12b is reduced, whereby the reliability of the operation of the semiconductor integrated circuit 10 can be improved.

Variation of First Embodiment

Figure 4:
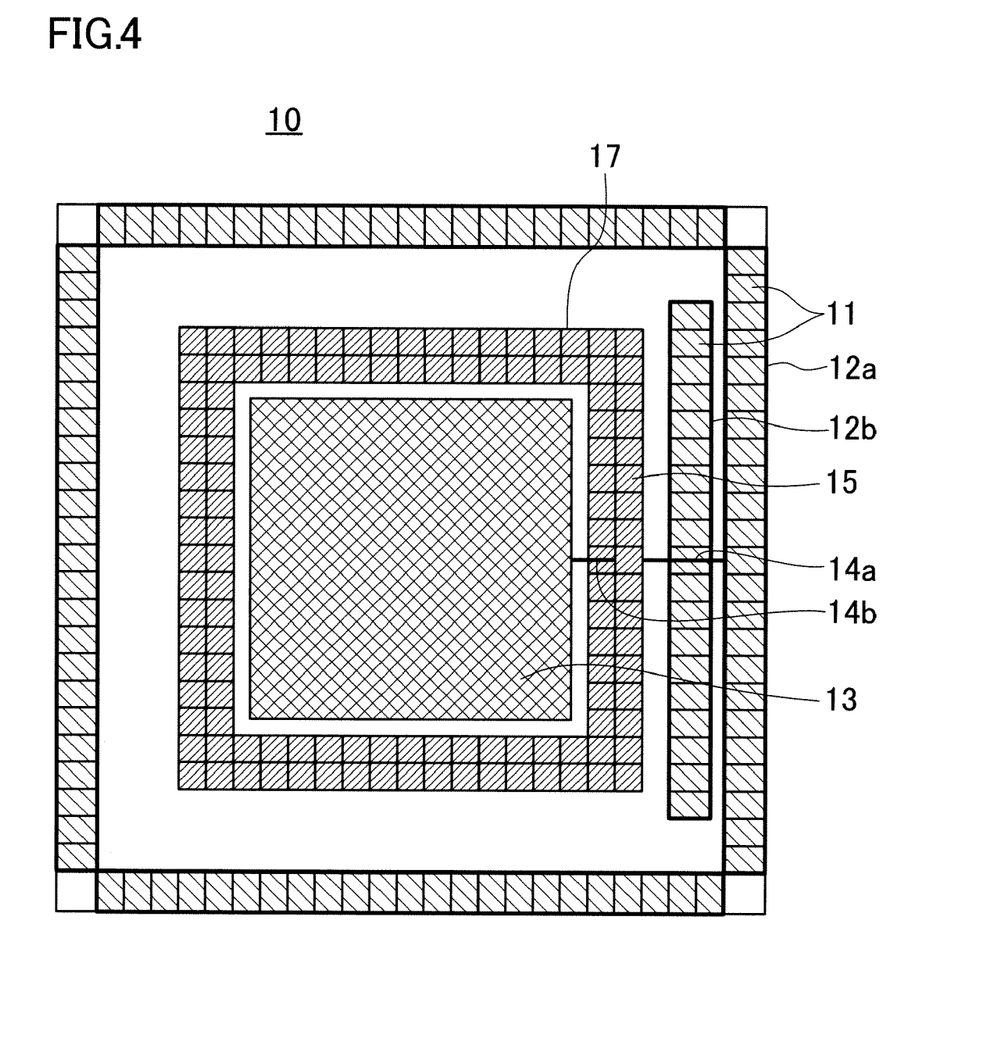
FIG. 4 is a plan view of a semiconductor integrated circuit according to a variation of the first embodiment of the present disclosure.

Although, in the first embodiment, the IO cells 11 are formed in the peripheral portion of the semiconductor integrated circuit 10 along the entire circumference, the inner IO cells 11 may be formed along only one of the four edges of the semiconductor integrated circuit 10 as shown in FIG. 4.

Figure 5:
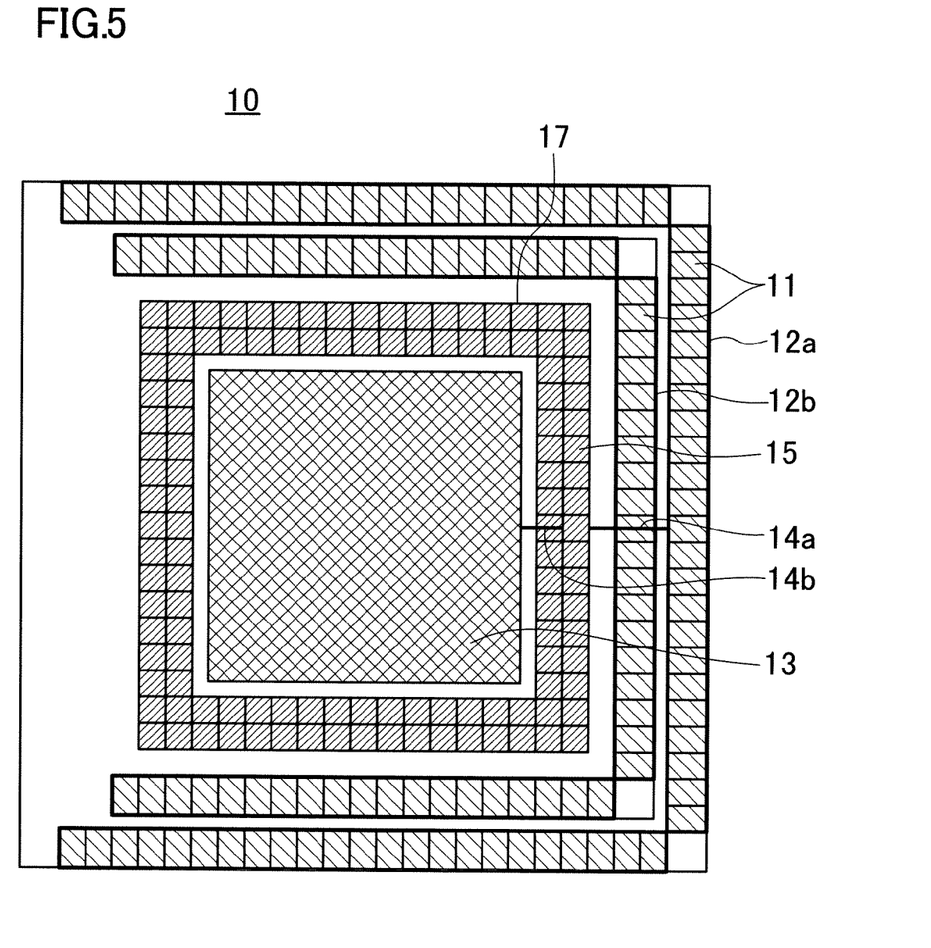
FIG. 5 is a plan view of a semiconductor integrated circuit according to another variation of the first embodiment of the present disclosure.

As shown in FIG. 5, the outer and inner IO cells 11 may not be formed along one of the four edges.

Figure 6:
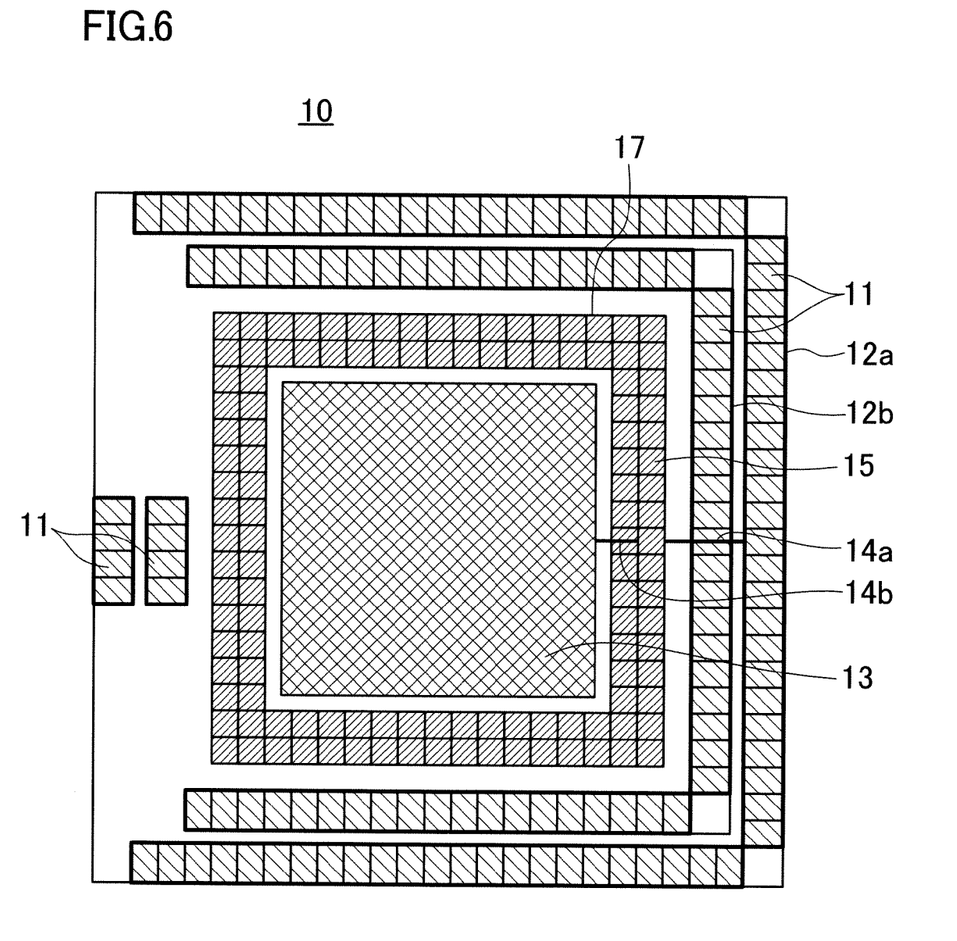
FIG. 6 is a plan view of a semiconductor integrated circuit according to still another variation of the first embodiment of the present disclosure.

As shown in FIG. 6, the outer and inner IO cells 11 may be formed along three of the four edges, but along only a portion of the remaining one of the four edges.

In the above configurations, in the region where the IO cells 11 are arranged in a double line, the influence of crosstalk can be reduced as in the first embodiment, whereby the reliability of the operation of the semiconductor integrated circuit 10 can be improved.

Figure 7:
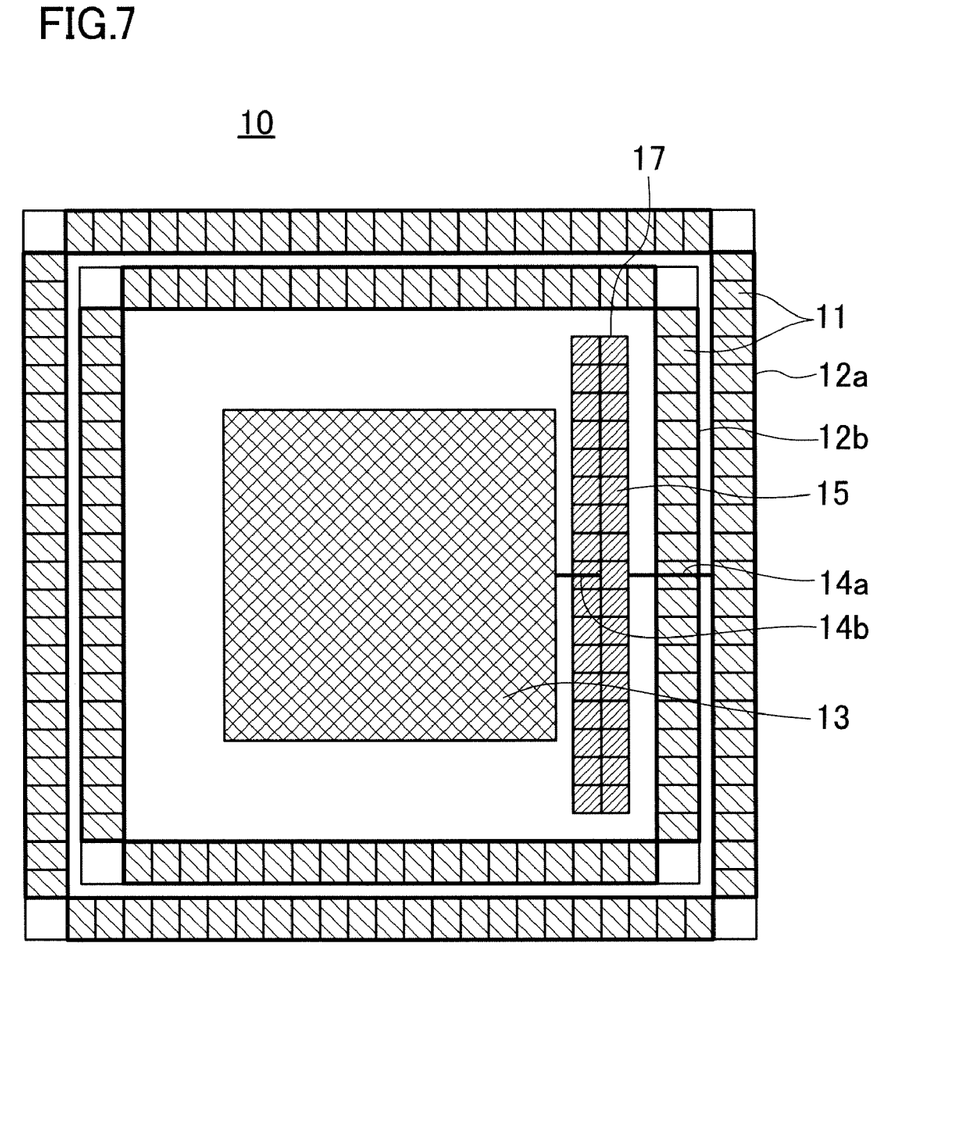
FIG. 7 is a plan view of a semiconductor integrated circuit according to still another variation of the first embodiment of the present disclosure.

As shown in FIG. 7, the level shift circuits 15 may be formed along only one of the four edges. In this case, in the region where the level shift circuits 15 are provided between the second IO cell region 12b and the internal circuit 13, the influence of crosstalk can be reduced as in the first embodiment, whereby the reliability of the operation of the semiconductor integrated circuit 10 can be improved.

Figure 8:
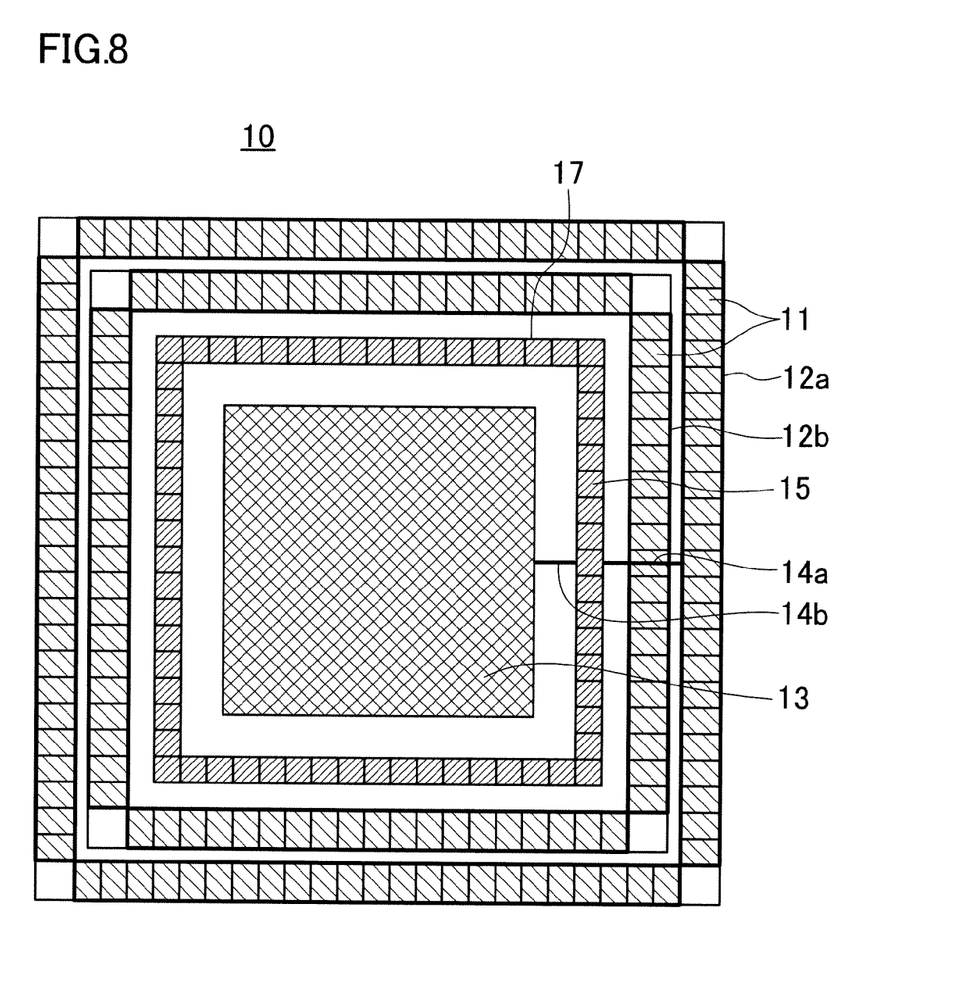
FIG. 8 is a plan view of a semiconductor integrated circuit according to still another variation of the first embodiment of the present disclosure.

As shown in FIG. 8, the level shift circuits 15 may be arranged in a single line. As a result, the overall area of the level shift circuit region 17 can be reduced, resulting in a further reduction in the chip size. Such a configuration is useful when a plurality of IO cells 11 are connected to one level shift circuit 15.

The level shift circuits 15 may be arranged in three or more lines (i.e., a triple or higher multiple line).

Figure 9:
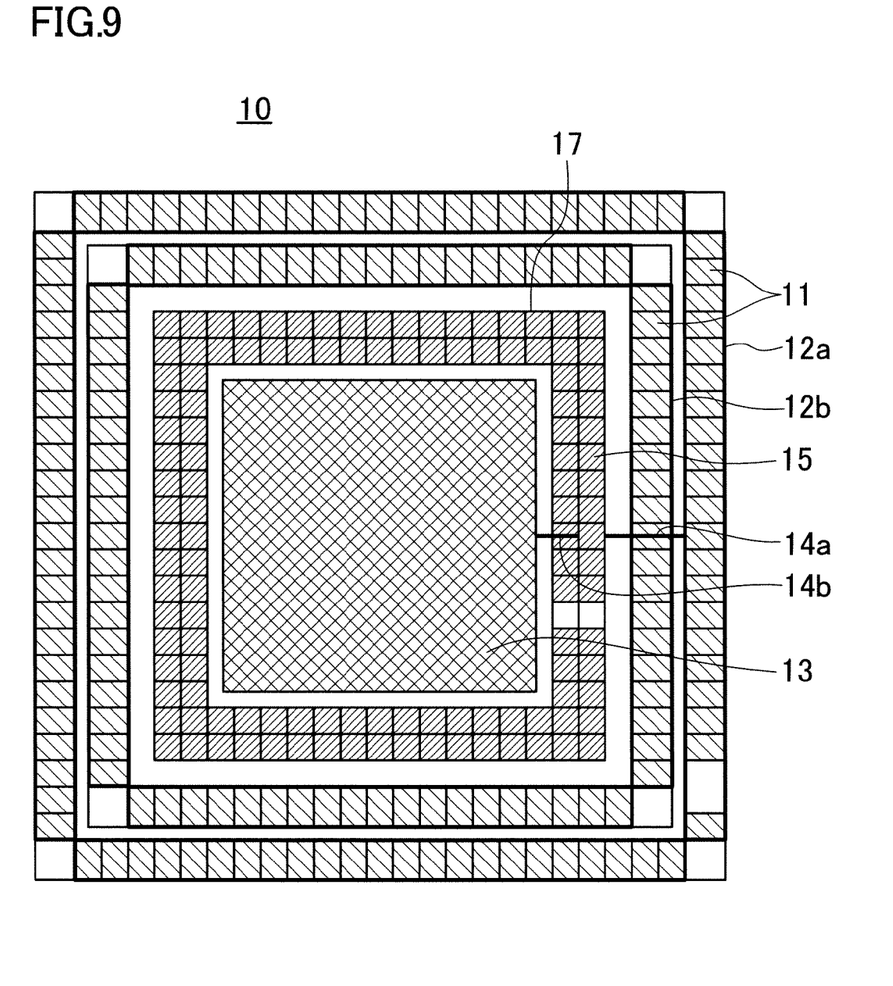
FIG. 9 is a plan view of a semiconductor integrated circuit according to still another variation of the first embodiment of the present disclosure.

Although, in the first embodiment, the IO cells 11 are arranged without a gap between each IO cell, there may be a gap between some IO cells 11 as shown in the FIG. 9. Similarly, although, in the first embodiment, the level shift circuits 15 are arranged without a gap between each level shift circuit, there may be a gap between some level shift circuits 15 as shown in FIG. 9.

Figure 10:
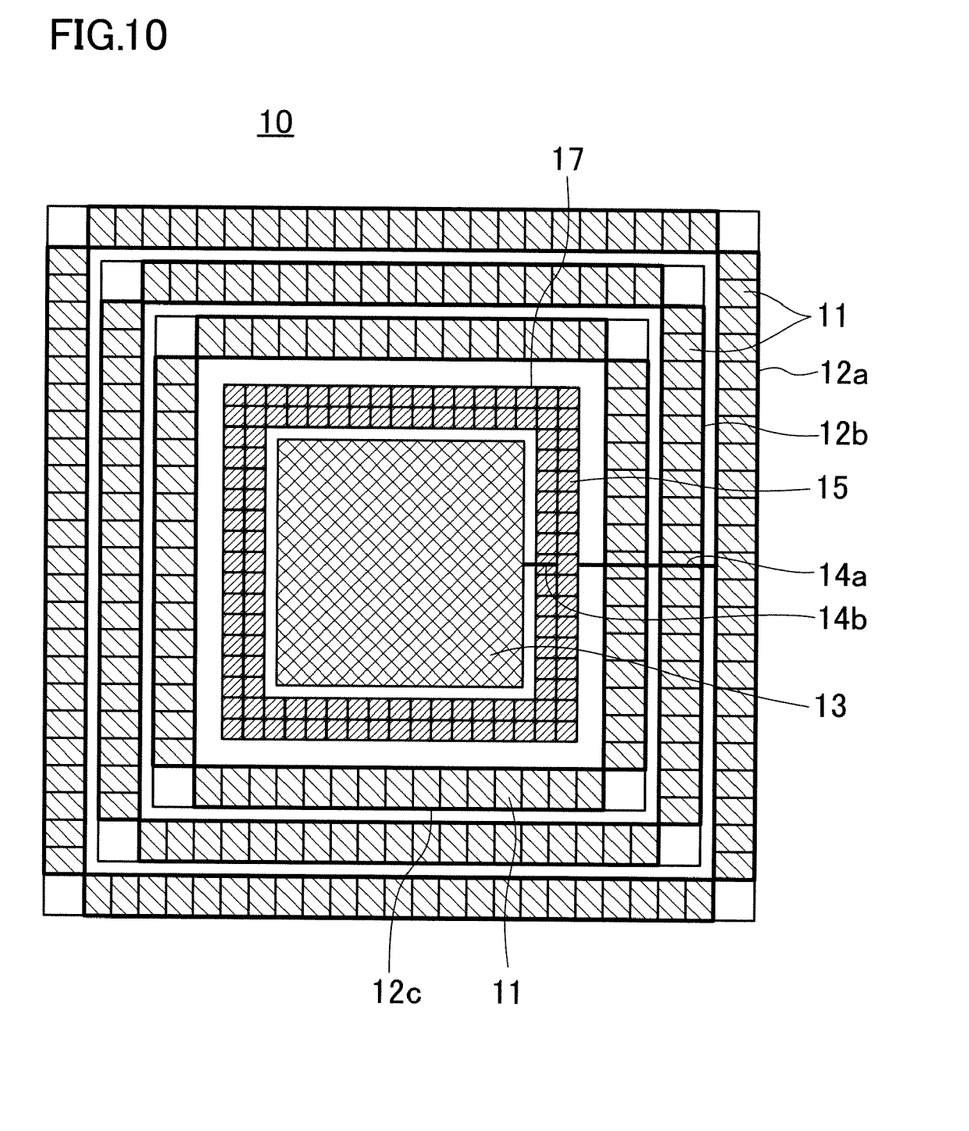
FIG. 10 is a plan view of a semiconductor integrated circuit according to still another variation of the first embodiment of the present disclosure.

Although, in the first embodiment, the two IO cell regions are provided (i.e., the IO cells are arranged in two lines (a double line)), three or more IO cell regions may be provided (i.e., the IO cells may be arranged in three or more lines (a triple or higher multiple line)). For example, as shown in FIG. 10, a third IO cell region 12c where a plurality of IO cells 11 are formed may be further provided in a region closer to the center of the semiconductor integrated circuit 10 than the second IO cell region 12b is, and level shift circuits which convert signals output from the IO cells 11 of the third IO cell region 12c into signals having an amplitude of 1.0 V may be provided in the level shift circuit region 17. Even if the three or more IO cell regions are provided, the influence of crosstalk on a signal transferred via a signal interconnect extending in the IO cell region (a signal input to and output from IO cell regions other than the innermost IO cell region) is reduced, whereby the reliability of the operation of the semiconductor integrated circuit 10 can be improved.

Although, in the first embodiment, the semiconductor integrated circuit 10 is configured to be operated using two voltages, i.e., 3.3 V and 1.0 V, the semiconductor integrated circuit 10 may be operated using three or more voltages. For example, the level shift circuit 15 may convert a voltage of 3.3 V into a voltage of 1.2 V and a voltage of 1.2 V into a voltage of 0.6 V. A plurality of types of level shift circuits which deal with different voltages may be provided in the level shift circuit region 17. For example, both a level shift circuit which converts a voltage of 3.3 V into a voltage of 1.0 V and a voltage of 1.0 V into 3.3 V and a level shift circuit which converts a voltage of 5.0 V into a voltage of 1.0 V and a voltage of 1.0 V into a voltage of 5.0 V may be provided.

Although, in the first embodiment, the semiconductor integrated circuit 10 is operated using fixed voltages, the semiconductor integrated circuit 10 may be operated using a variable voltage which is changed by a substrate bias control (dynamic voltage and frequency scaling: DVFS).

Second Embodiment

Figure 11:
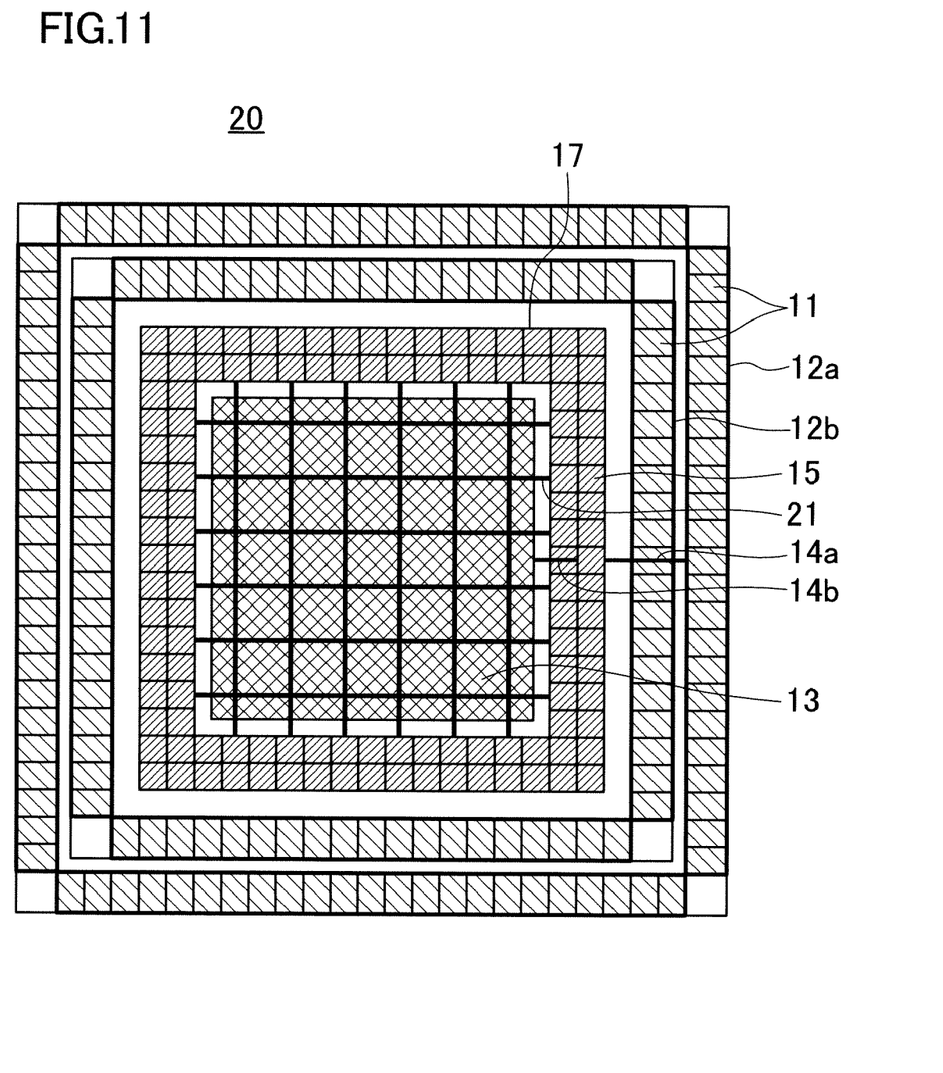
FIG. 11 is a plan view of a semiconductor integrated circuit according to a second embodiment of the present disclosure.

FIG. 11 shows a semiconductor integrated circuit 20 according to a second embodiment of the present disclosure. In the semiconductor integrated circuit 20, internal circuit power supply interconnects 21 are laid out in a grid to cover the entirety of an internal circuit 13. The internal circuit power supply interconnects 21 supply an internal circuit power supply (second voltage) of 1.0 V to the internal circuit 13 and level shift circuits 15 in a level shift circuit region 17.

Figure 12:
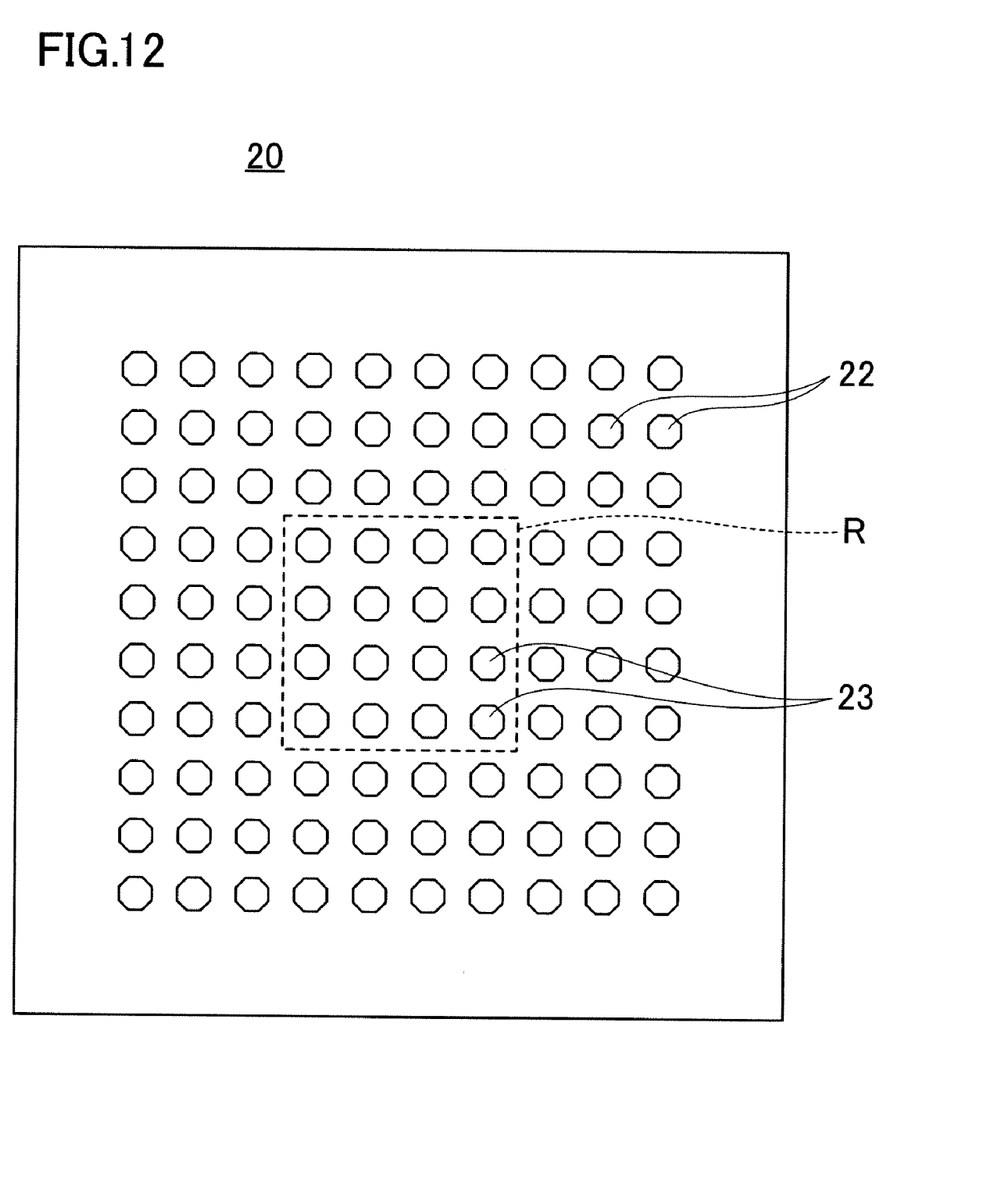
FIG. 12 is another plan view of the semiconductor integrated circuit of the second embodiment of the present disclosure.

As shown in FIG. 12, a plurality of solder balls 22 are provided in a matrix on a main surface of the semiconductor integrated circuit 20. An external signal and a power supply are applied via the solder balls 22 to the inside of the semiconductor integrated circuit 20. Some of the solder balls 22 that are located in a square-shaped center region R (hereinafter referred to as internal circuit power supply solder balls 23) are connected to the internal circuit power supply interconnects 21 via vias and interconnects (not shown).

The other components are the same as those of the first embodiment and are indicated by the same reference characters, and will not be described in detail.

The level shift circuits 15 are provided between the second IO cell region 12b and the internal circuit 13. Therefore, the internal circuit power supply interconnects 21 for supplying a signal having an amplitude of 1.0 V to the level shift circuits 15 do not need to be extended to the IO cells 11 in the first IO cell region 12a which is farther from the center of the semiconductor integrated circuit 20 than the second IO cell region 12b into and from which a signal having an amplitude of 3.3 V is input and output.

According to the second embodiment, the signal and power supply having an amplitude of 1.0 V which are transferred via the internal circuit power supply interconnect 21 do not pass through the first and second IO cell regions 12a and 12b into and from which a signal having an amplitude of 3.3 V is input and output. Therefore, the influence of crosstalk can be reduced, whereby the reliability of the operation of the semiconductor integrated circuit 20 can be improved. This advantage is particularly significant when the internal circuit power supply interconnects 21 are provided by using area pad bonding, flip chip bonding, etc. in which the active region of a semiconductor element is provided below a bonding pad.

Although, in the second embodiment, the internal circuit power supply solder balls 23 are arranged in a matrix in the entire center region R, the internal circuit power supply solder balls 23 may be provided in only a portion of the center region R.

Although, in the second embodiment, the internal circuit power supply interconnects 21 are arranged in a grid, the arrangement of the internal circuit power supply interconnects 21 is not limited to this pattern. The internal circuit power supply interconnects 21 may be arranged in any pattern that allows the internal circuit power supply to be supplied to the internal circuit 13 and the level shift circuits 15 in the level shift circuit region 17. Similarly, the arrangement of the solder balls 22 is not limited to a matrix pattern.

Although, in the first and second embodiments, the amplitude (3.3 V) of a signal input to the IO cell 11 and a signal output from the IO cell 11 is higher than the amplitude (1.0 V) of a signal used in the internal circuit 13, the amplitude of a signal used in the internal circuit 13 may be higher than the amplitude of a signal input to the IO cell 11 and a signal output from the IO cell 11. Even in this case, as in the first and second embodiments, the influence of crosstalk can be reduced, whereby the reliability of the operation of the semiconductor integrated circuits 10 and 20 can be improved.

In the first and second embodiments, a signal output from the IO cell 11 of the first IO cell region 12a is input via the first voltage signal interconnect 14a to the level shift circuit 15, and the internal circuit 13 is operated using a signal output from the level shift circuit 15. Conversely, the level shift circuit 15 may convert the signal having an amplitude of 1.0 V output from the internal circuit 13 into a signal having an amplitude of 3.3 V and output the resultant signal, and the signal having an amplitude of 3.3 V output from the level shift circuit 15 may be input via the first voltage signal interconnect 14a to the IO cell 11 of the first IO cell region 12a. Such functions of the level shift circuit 15 and the first voltage signal interconnect 14a may be provided instead of or in addition to the functions of the level shift circuit 15 and the first voltage signal interconnect 14a of the first and second embodiments.

Similarly, even when the third IO cell region 12c is provided, the level shift circuit 15 may convert the signal having an amplitude of 1.0 V output from the internal circuit 13 into a signal having an amplitude of 3.3 V and output the resultant signal, and the signal having an amplitude of 3.3 V output from the level shift circuit 15 may be input via the first voltage signal interconnect 14a to the IO cell 11 of the third IO cell region 12c.

The present disclosure is directed to semiconductor integrated circuits having level shift circuits, and is particularly useful when IO cell regions are provided in the peripheral portion and are arranged in a multiple line.

What is claimed is:

1. A semiconductor integrated circuit, comprising:
a first IO cell region and a second IO cell region each including at least one IO cell into and from which a signal having amplitude of a first voltage is input and output;
a level shift circuit region located so that the second IO cell region is interposed between the level shift circuit region and the first IO cell region, the level shift circuit region including a plurality of level shift circuits arranged in a double or higher multiple line, one of the plurality of level shift circuits being configured to convert a signal output from the IO cell of the first IO cell region into a signal having amplitude of a second voltage and output the signal having the amplitude of the second voltage; and
an internal circuit configured to be operated using the signal having the amplitude of the second voltage output from the one of the plurality of level shift circuits,
wherein a signal interconnect via which the signal output from the IO cell of the first IO cell region is input to the one of the plurality of level shift circuits is provided between the cell of the first IO cell region and the one of the plurality of level shift circuits, extending over or in the IO cell of the second IO cell region.

2. The semiconductor integrated circuit of claim 1, further comprising:
a third IO cell region including at least one IO cell into and from which the signal having the amplitude of the first voltage is input and output,
wherein the third IO cell region is provided between the first IO cell region and the level shift circuit region.

3. The semiconductor integrated circuit of claim 2, wherein:
one of the plurality of level shift circuits is configured to have at least one of a function of converting the signal output from the IO cell of the third IO cell region into the signal having the amplitude of the second voltage and outputting the signal having the amplitude of the second voltage and a function of converting the signal having the amplitude of the second voltage output from the internal circuit into the signal having the amplitude of the first voltage and outputting the signal having the amplitude of the first voltage.

4. The semiconductor integrated circuit of claim 1, wherein:
the semiconductor integrated circuit is in the shape of a square, and
the first IO cell region is provided in a peripheral portion of the semiconductor integrated circuit and along at least one edge of the semiconductor integrated circuit.

5. The semiconductor integrated circuit of claim 4, wherein the first IO cell region is provided in the peripheral portion of the semiconductor integrated circuit and along an entire circumference of the semiconductor integrated circuit.

6. The semiconductor integrated circuit of claim 1, wherein:
one of the plurality of level shift circuits is configured to have at least one of a function of converting the signal output from the IO cell of the second IO cell region into the signal having the amplitude of the second voltage and outputting the signal having the amplitude of the second voltage and a function of converting the signal having the amplitude of the second voltage output from the internal circuit into the signal having the amplitude of the first voltage and outputting the signal having the amplitude of the first voltage.

7. The semiconductor integrated circuit of claim 1, wherein the IO cell of the second IO cell region is provided between the IO cell of the first IO cell region and the one of the plurality of level shift circuits.

8. The semiconductor integrated circuit of claim 1, wherein the first voltage is higher than the second voltage.

9. The semiconductor integrated circuit of claim 1, further comprising:
a power supply interconnect configured to supply the second voltage to the one of the plurality of level shift circuits.

10. The semiconductor integrated circuit of claim 9, wherein
a plurality of power supply interconnects are provided, and the plurality of power supply interconnects are arranged in a grid.

11. A semiconductor integrated circuit, comprising:
a first IO cell region and a second IO cell region each including at least one IO cell into and from which a signal having amplitude of a first voltage is input and output;
an internal circuit configured to be operated using a signal having amplitude of a second voltage; and a level shift circuit region located so that the second IO cell region is interposed between the level shift circuit region and the first IO cell region, the level shift circuit region including a plurality of level shift circuits arranged in a double or higher multiple line, one of the plurality of level shift circuits being configured to convert the signal having the amplitude of the second voltage output from the internal circuit into the signal having the amplitude of the first voltage and output the signal having the amplitude of the first voltage, wherein a signal interconnect via which the signal output from the one of the plurality of level shift circuits is input to the IO cell of the first IO cell region is provided between the cell of the first IO cell region and the one of the plurality of level shift circuits, extending over or in the IO cell of the second IO cell region.

12. The semiconductor integrated circuit of claim 11, further comprising:

a third IO cell region including at least one IO cell into and from which the signal having the amplitude of the first voltage is input and output, wherein the third IO cell region is provided between the first IO cell region and the level shift circuit region.

13. The semiconductor integrated circuit of claim 12, wherein one of the plurality of level shift circuits is configured to have at least one of a function of converting the signal output from the IO cell of the third IO cell region into the signal having the amplitude of the second voltage and outputting the signal having the amplitude of the second voltage and a function of converting the signal having the amplitude of the second voltage output from the internal circuit into the signal having the amplitude of the first voltage and outputting the signal having the amplitude of the first voltage.

14. The semiconductor integrated circuit of claim 11, wherein:

the semiconductor integrated circuit is in the shape of a square, and the first IO cell region is provided in a peripheral portion of the semiconductor integrated circuit and along at least one edge of the semiconductor integrated circuit.

15. The semiconductor integrated circuit of claim 14, wherein the first IO cell region is provided in the peripheral portion of the semiconductor integrated circuit and along an entire circumference of the semiconductor integrated circuit.

16. The semiconductor integrated circuit of claim 11, wherein one of the plurality of level shift circuits is configured to have at least one of a function of converting the signal output from the IO cell of the second IO cell region into the signal having the amplitude of the second voltage and outputting the signal having the amplitude of the second voltage and a function of converting the signal having the amplitude of the second voltage output from the internal circuit into the signal having the amplitude of the first voltage and outputting the signal having the amplitude of the first voltage.

17. The semiconductor integrated circuit of claim 11, wherein the IO cell of the second IO cell region is provided between the IO cell of the first IO cell region and the one of the plurality of level shift circuits.

18. The semiconductor integrated circuit of claim 11, wherein the first voltage is higher than the second voltage.

19. The semiconductor integrated circuit of claim 11, further comprising:

a power supply interconnect configured to supply the second voltage to the one of the plurality of level shift circuits.

20. The semiconductor integrated circuit of claim 19, wherein a plurality of power supply interconnects are provided, and the plurality of power supply interconnects are arranged in a grid.

21. A semiconductor integrated circuit comprising:

a first IO cell region and a second IO cell region each including at least one IO cell into and from which a signal having amplitude of a first voltage is input and output;

a first level shift circuit located so that the second IO cell region is interposed between the first level shift circuit and the first IO cell region, and configured to convert a signal output from the IO cell of the first IO cell region into a signal having amplitude of a second voltage and output the signal having the amplitude of the second voltage;

an internal circuit configured to be operated using the signal having the amplitude of the second voltage output from the first level shift circuit; and a power supply interconnect configured to supply the second voltage to the first level shift circuit, wherein:

a signal interconnect via which the signal output from the IO cell of the first IO cell region is input to the first level shift circuit is provided between the IO cell of the first IO cell region and the first level shift circuit, extending over or in the IO cell of the second IO cell region, and a pad configured to supply the second voltage to the power supply interconnect is provided in the internal circuit.

22. The semiconductor integrated circuit of claim 21, further comprising:

a third IO cell region including at least one IO cell into and from which the signal having the amplitude of the first voltage is input and output, wherein the third IO cell region is provided between the first IO cell region and the first level shift circuit.

23. The semiconductor integrated circuit of claim 22, further comprising:

a second level shift circuit located so that the third IO cell region is interposed between the second level shift circuit and the first IO cell region, and configured to have at least one of a function of converting the signal output from the IO cell of the third IO cell region into the signal having the amplitude of the second voltage and outputting the signal having the amplitude of the second voltage and a function of converting the signal having the amplitude of the second voltage output from the internal circuit into the signal having the amplitude of the first voltage and outputting the signal having the amplitude of the first voltage.

24. The semiconductor integrated circuit of claim 21, wherein:

the semiconductor integrated circuit is in the shape of a square, and the first IO cell region is provided in a peripheral portion of the semiconductor integrated circuit and along at least one edge of the semiconductor integrated circuit.

25. The semiconductor integrated circuit of claim 24, wherein
the first IO cell region is provided in the peripheral portion of the semiconductor integrated circuit and along an entire circumference of the semiconductor integrated circuit.

26. The semiconductor integrated circuit of claim 21, further comprising:
a second level shift circuit located so that the second IO cell region is interposed between the second level shift circuit and the first IO cell region, and configured to have at least one of a function of converting the signal output from the IO cell of the second IO cell region into the signal having the amplitude of the second voltage and outputting the signal having the amplitude of the second voltage and a function of converting the signal having the amplitude of the second voltage output from the internal circuit into the signal having the amplitude of the first voltage and outputting the signal having the amplitude of the first voltage.

27. The semiconductor integrated circuit of claim 21, wherein
the IO cell of the second IO cell region is provided between the IO cell of the first IO cell region and the first level shift circuit.

28. The semiconductor integrated circuit of claim 21, wherein
the first voltage is higher than the second voltage.

29. The semiconductor integrated circuit of claim 21, wherein
a plurality of power supply interconnects are provided, and the plurality of power supply interconnects are arranged in a grid.

30. The semiconductor integrated circuit of claim 21, wherein
the pad supplies a power supply to the power supply interconnect.

31. The semiconductor integrated circuit of claim 21, wherein
the pad is an area pad.

32. A semiconductor integrated circuit comprising:
a first IO cell region and a second IO cell region each including at least one IO cell into and from which a signal having amplitude of a first voltage is input and output;
an internal circuit configured to be operated using a signal having amplitude of a second voltage;
a first level shift circuit located so that the second IO cell region is interposed between the first level shift circuit and the first IO cell region, and configured to convert the signal having the amplitude of the second voltage output from the internal circuit into the signal having the amplitude of the first voltage and output the signal having the amplitude of the first voltage; and
a power supply interconnect configured to supply the second voltage to the first level shift circuit, wherein:
a signal interconnect via which the signal output from the first level shift circuit is input to the IO cell of the first IO cell region is provided between the IO cell of the first IO cell region and the first level shift circuit, extending over or in the IO cell of the second IO cell region, and
a pad configured to supply the second voltage to the power supply interconnect is provided in the internal circuit.

33. The semiconductor integrated circuit of claim 32, further comprising:
a third IO cell region including at least one IO cell into and from which the signal having the amplitude of the first voltage is input and output,
wherein the third IO cell region is provided between the first IO cell region and the first level shift circuit.

34. The semiconductor integrated circuit of claim 33, further comprising:
a second level shift circuit located so that the third IO cell region is interposed between the second level shift circuit and the first IO cell region, and configured to have at least one of a function of converting the signal output from the IO cell of the third IO cell region into the signal having the amplitude of the second voltage and outputting the signal having the amplitude of the second voltage and a function of converting the signal having the amplitude of the second voltage output from the internal circuit into the signal having the amplitude of the first voltage and outputting the signal having the amplitude of the first voltage.

35. The semiconductor integrated circuit of claim 32, wherein:
the semiconductor integrated circuit is in the shape of a square, and
the first IO cell region is provided in a peripheral portion of the semiconductor integrated circuit and along at least one edge of the semiconductor integrated circuit.

36. The semiconductor integrated circuit of claim 35, wherein
the first IO cell region is provided in the peripheral portion of the semiconductor integrated circuit and along an entire circumference of the semiconductor integrated circuit.

37. The semiconductor integrated circuit of claim 32, further comprising:
a second level shift circuit located so that the second IO cell region is interposed between the second level shift circuit and the first IO cell region, and configured to have at least one of a function of converting the signal output from the IO cell of the second IO cell region into the signal having the amplitude of the second voltage and outputting the signal having the amplitude of the second voltage and a function of converting the signal having the amplitude of the second voltage output from the internal circuit into the signal having the amplitude of the first voltage and outputting the signal having the amplitude of the first voltage.

38. The semiconductor integrated circuit of claim 32, wherein
the IO cell of the second IO cell region is provided between the IO cell of the first IO cell region and the first level shift circuit.

39. The semiconductor integrated circuit of claim 32, wherein
the first voltage is higher than the second voltage.

40. The semiconductor integrated circuit of claim 39, wherein
a plurality of power supply interconnects are provided, and the plurality of power supply interconnects are arranged in a grid.

41. The semiconductor integrated circuit of claim 32, wherein
the pad supplies a power supply to the power supply interconnect.

42. The semiconductor integrated circuit of claim 32, wherein
the pad is an area pad.

* * * * *